United States Patent [19]

Elmer

[11] 3,942,236

[45] Mar. 9, 1976

[54] CONTINUOUS MOTION ASSEMBLY MACHINE WITH ROTARY ASSEMBLY MOTION

[75] Inventor: James W. Elmer, Anoka, Minn.

[73] Assignee: Inventors Engineering, Inc., Minneapolis, Minn.

[22] Filed: Dec. 16, 1974

[21] Appl. No.: 533,330

[52] U.S. Cl. ............ 29/208 R; 29/203 R; 29/208 E
[51] Int. Cl.² .......................................... B23P 19/04
[58] Field of Search .......... 29/208 R, 208 E, 203 R, 29/208 F, 211 R

[56] References Cited
UNITED STATES PATENTS

| | | | |
|---|---|---|---|
| 3,142,078 | 7/1964 | Pipes | 29/208 R X |
| 3,226,744 | 1/1966 | Marechal et al. | 29/208 R X |
| 3,491,425 | 1/1970 | McConnell et al. | 29/208 X |
| 3,634,920 | 1/1972 | Maguire | 29/208 F |
| 3,750,256 | 8/1973 | Elmer | 29/208 B |
| 3,827,127 | 8/1974 | Tanihata et al. | 29/208 F X |

*Primary Examiner*—Victor A. DiPalma
*Attorney, Agent, or Firm*—Dugger, Johnson & Westman

[57] ABSTRACT

A continuous motion assembly machine for assembling parts which require rotary assembly motion such as putting together two threadably assembled parts. The machine includes a plurality of assembly devices mounted on a rotating support which are operated as they rotate to pick up a first part, and to provide inspection of the parts, which in the form shown is the presence or absence, proper position and proper fit of parts, and assemble the parts and reject any parts that are improperly assembled, remove the good parts, and repeat the cycle. The assembly is carried out with rotary assembly motion between the two parts and which rotary motion can be controlled at a desired torque level for insuring proper assembly and operation of the parts.

10 Claims, 16 Drawing Figures

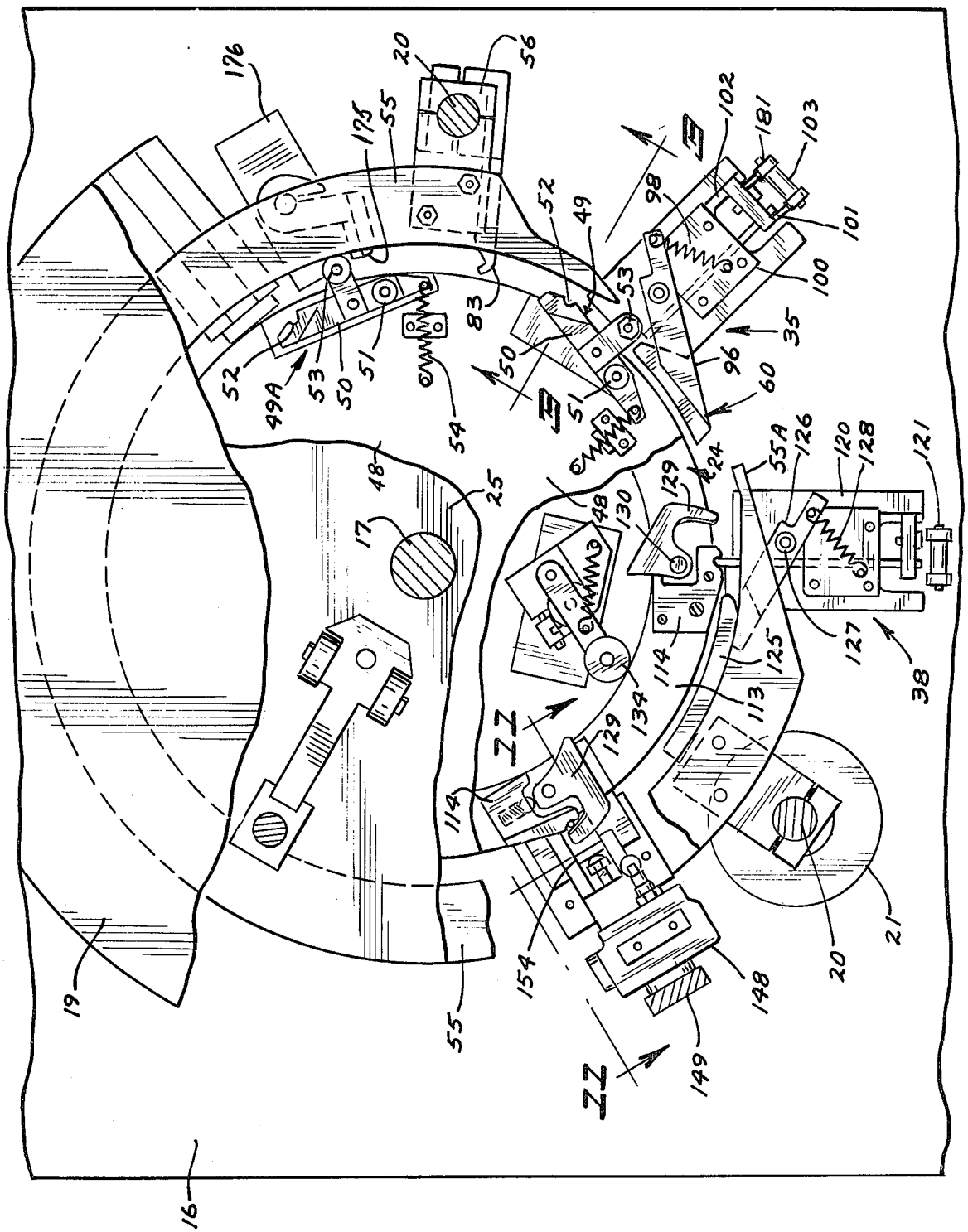

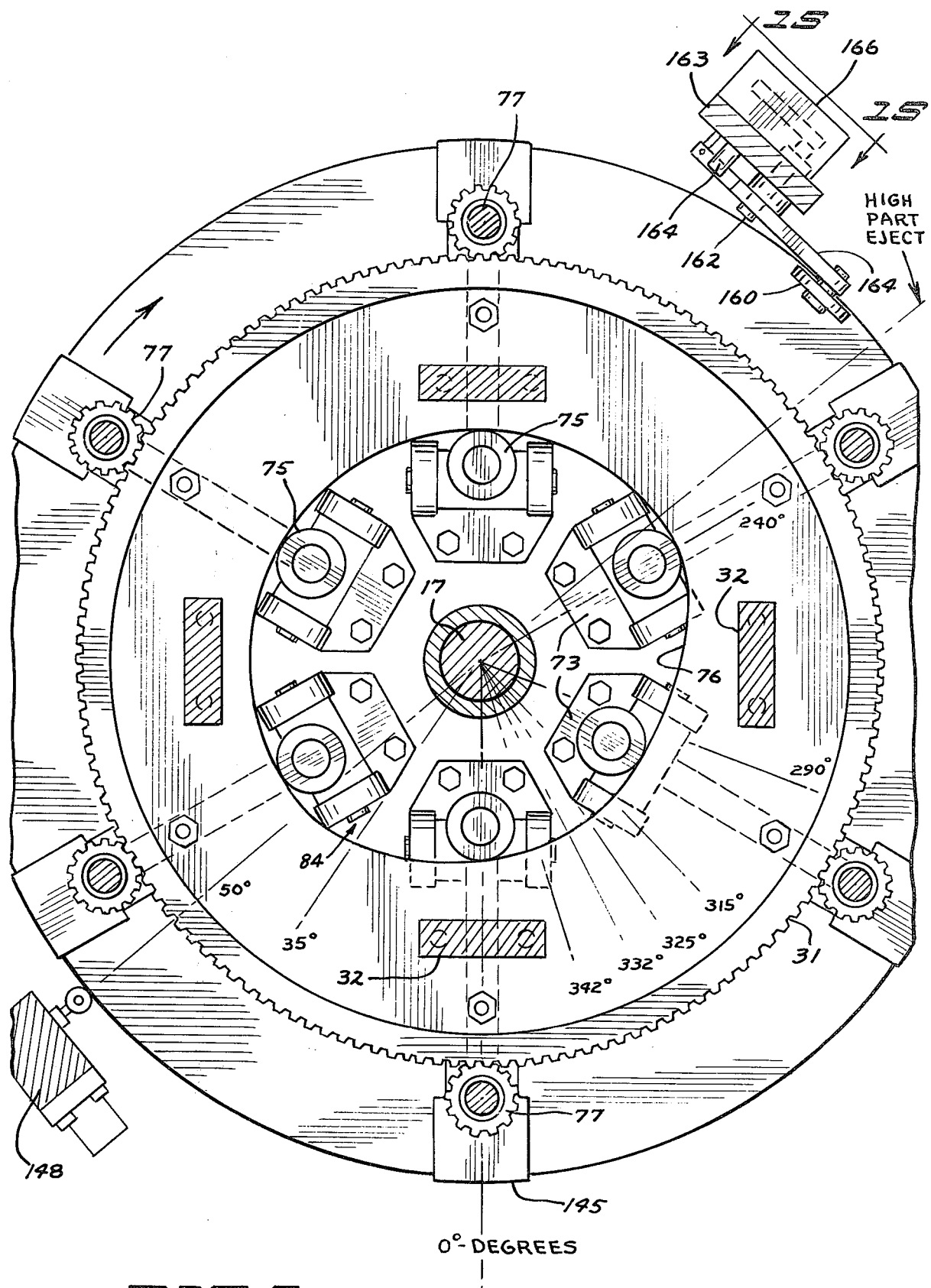

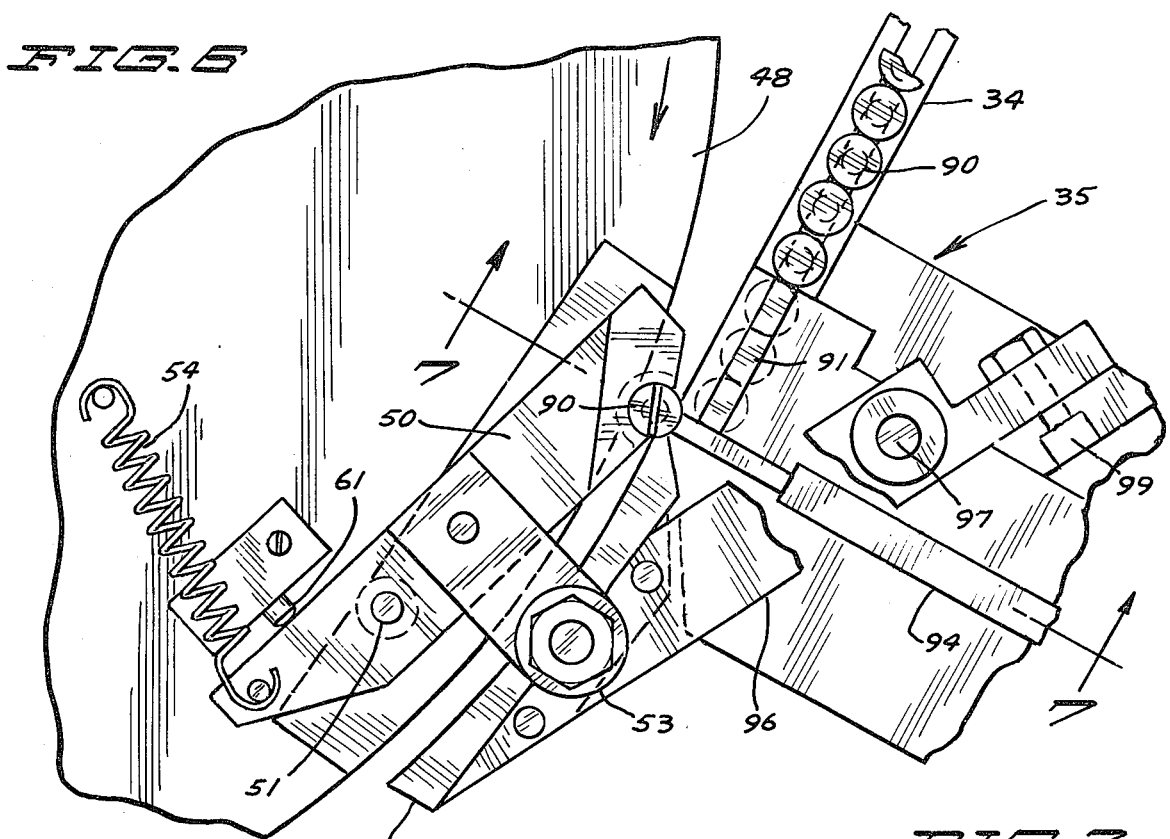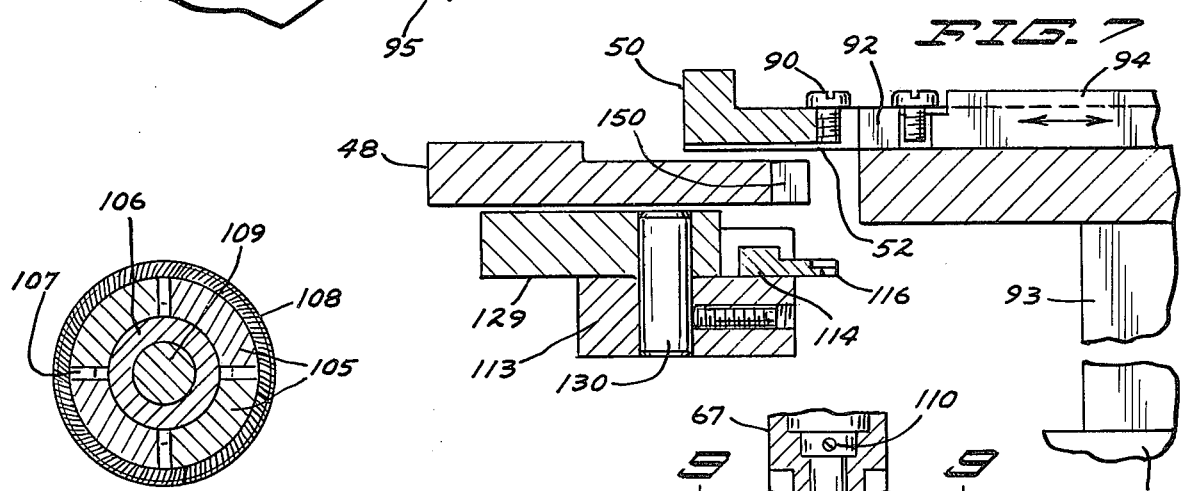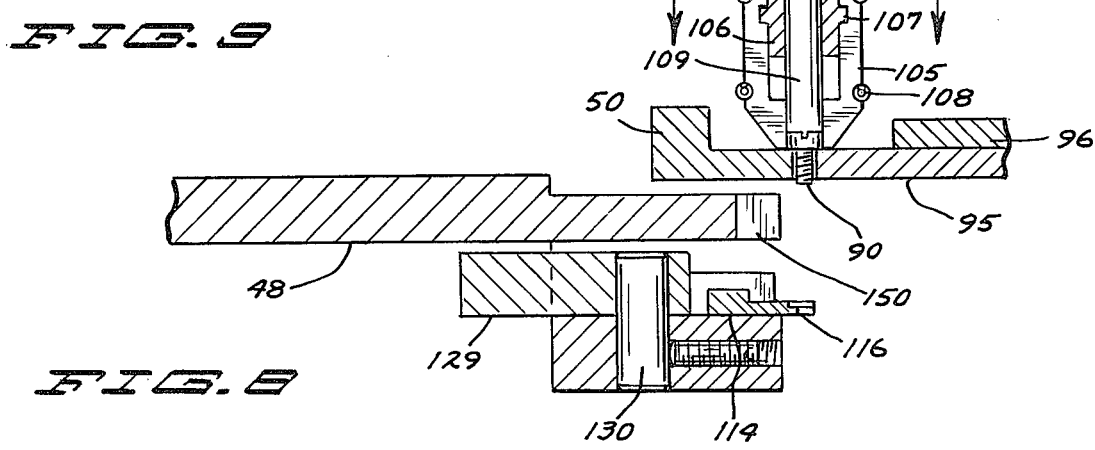

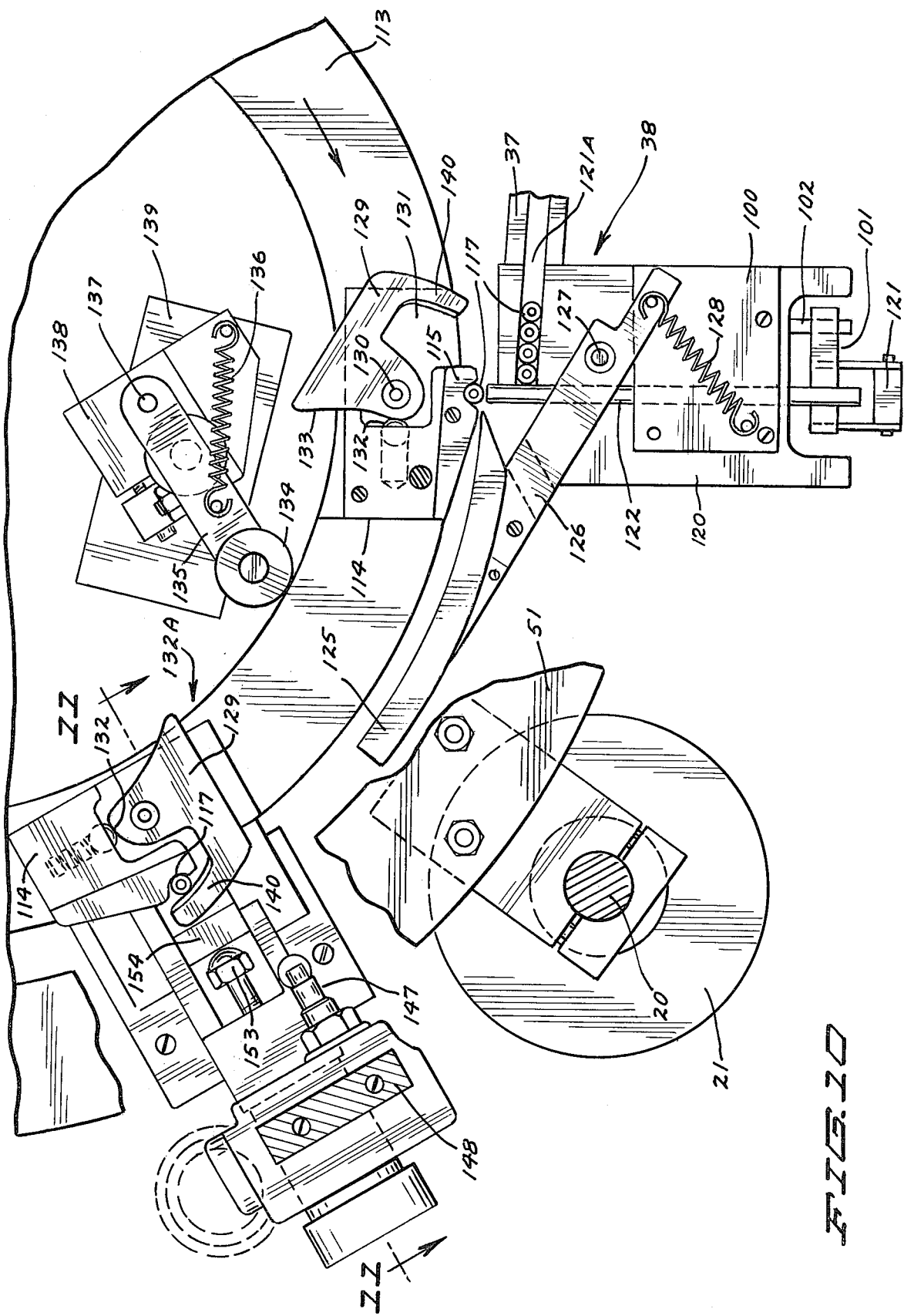

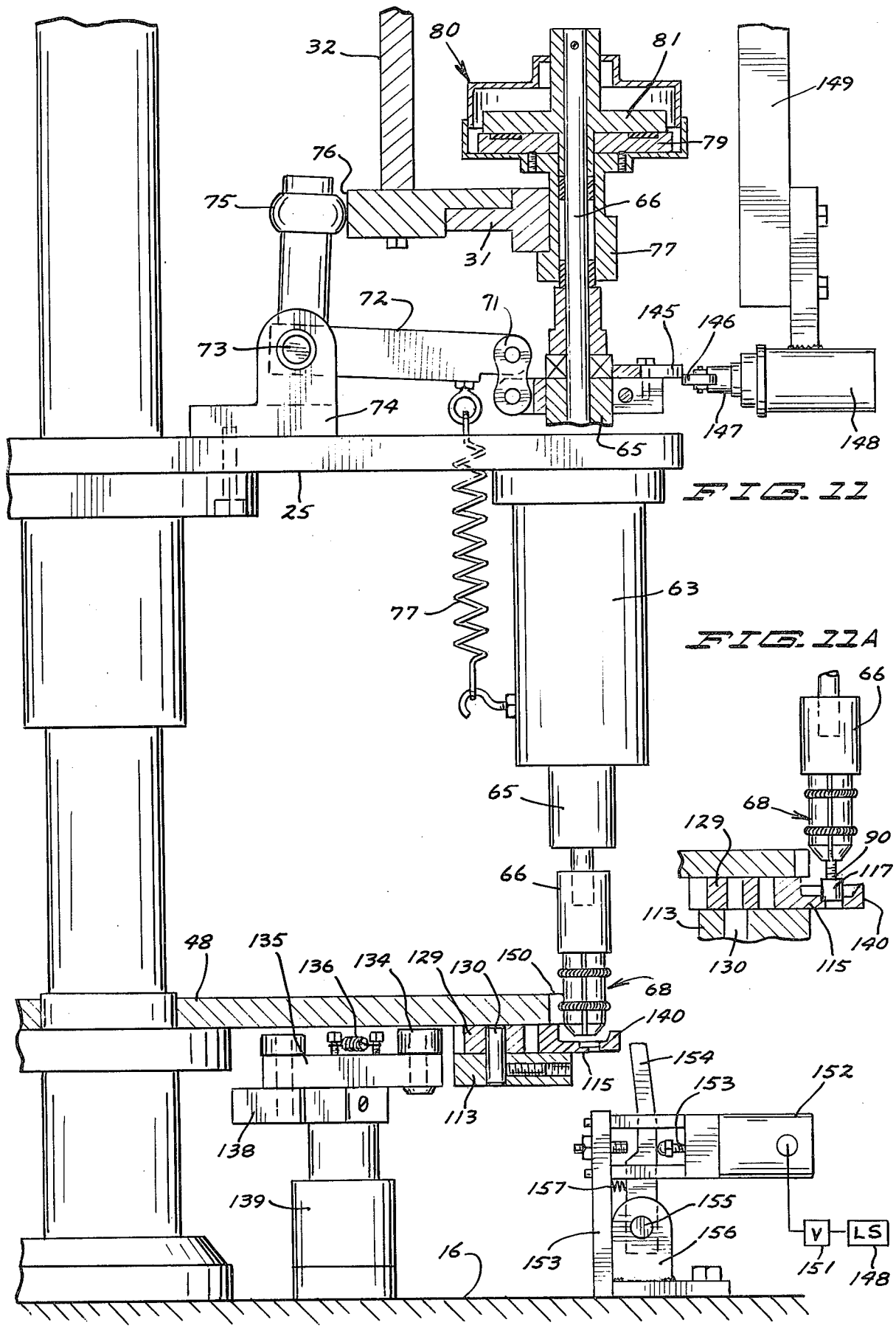

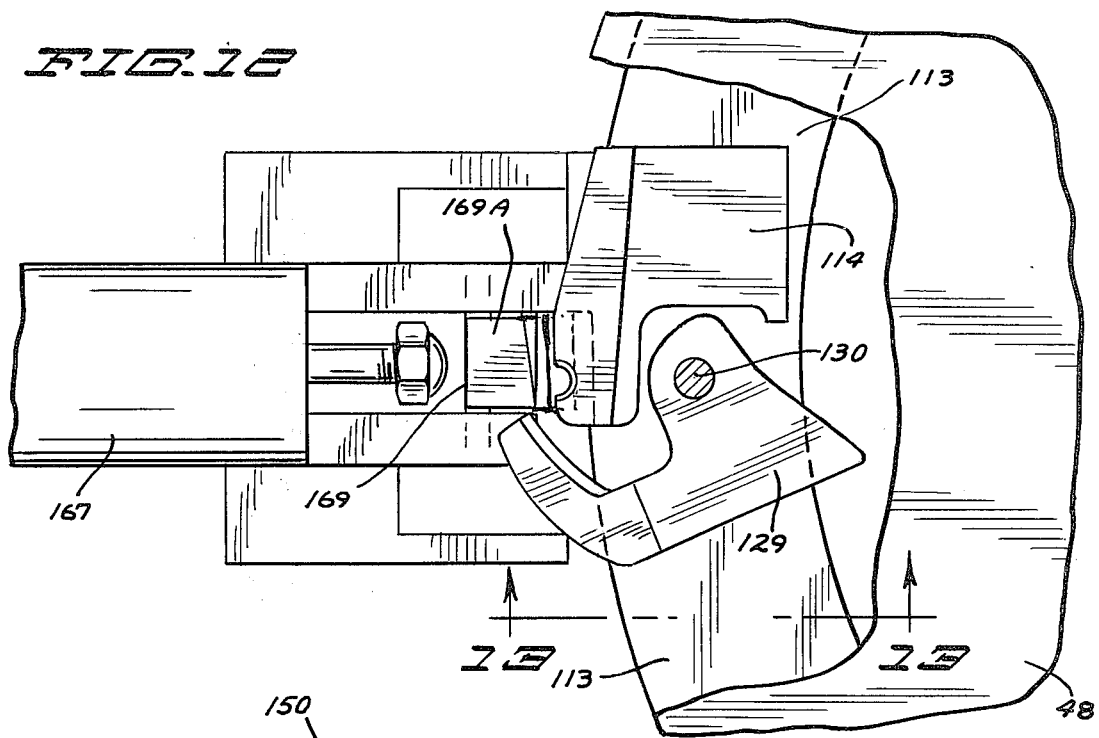
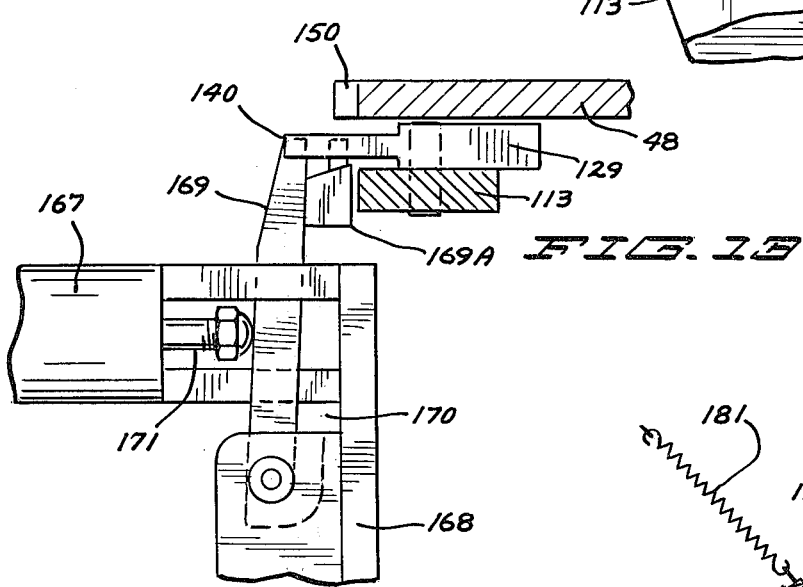
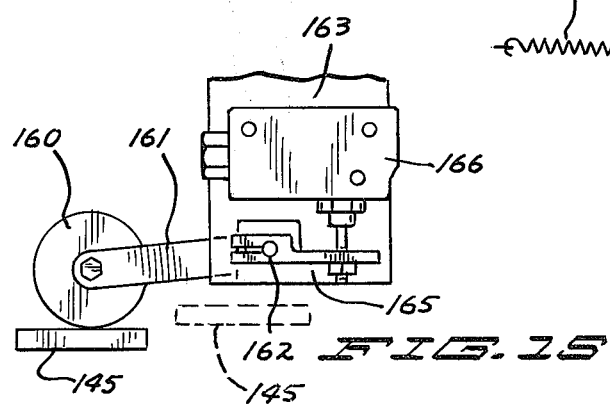
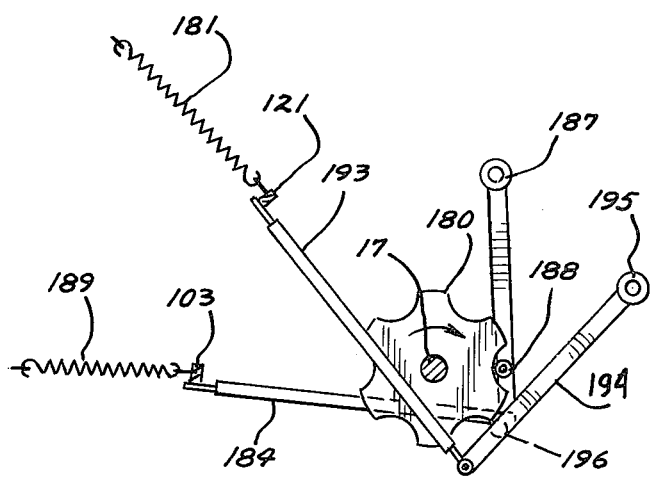

CONTINUOUS MOTION ASSEMBLY MACHINE WITH ROTARY ASSEMBLY MOTION

BACKGROUND OF THE INVENTION

1. Field of the Invention

The present invention relates to assembly machines utilizing a continuous rotary motion during the assembly operation.

2. Prior Art

Reference is made to my U.S. Pat. No. 3,750,256 for Continuous Motion Two Part Assembly Machine which encompasses the basic idea of continuous motion assembly, but which used in linear actuation for the assembly of two parts in a direction substantially parallel to the axis of rotation.

SUMMARY OF THE INVENTION

The present invention relates to an assembly machine for assembling two parts which are rotated with respect to each other during the assembly operation. Such parts can be a screw and a receptacle, as in the form shown, but could also be other types of parts where a rotary motion between the parts is necessary at the same time as an axial or linear motion.

In the form shown, electrical terminals are preassembled by threading a screw into a brass body, which assembled terminals will be used in a later assembly operation. The threadable member comprising a screw, is mounted into a spring loaded pick up chuck, and the chuck is on a spindle that operates in axial direction as it rotates about it own axis The individual spindles are mounted onto a member rotating about a central axis so that the spindles revolve around the central axis at the same time they rotate. The spindle is continuously rotated through a torque limiting clutch as it revolves through its cycle of operation. The second part comprising the brass body is loaded onto the main support below the spindle and screw. An inspection staton is provided to determine whether or not the screw is present and held satisfactorily, or if the screw is not grossly undersize or if the brass body is properly held and not grossly oversize as far as the screw opening is concerned and also the inspection determines if the screw is long enough.

If the parts are within this initial inspection criteria, the brass body is retained from rotation and the screw is rotated so that the screw is threaded into the brass body. If the threads mismatch, the screw may not thread into the brass body a sufficient distance to be properly assembled. A subsequent inspection station adjacent the periphery of the mounting member determines whether or not the brass body and the screw have been threaded together a sufficient amount after the assembly device has revolved to this station. If not properly threaded together the parts are rejected. If they are properly assembled the chuck is lifted off the screw head and the good parts are ejected at an appropriate station.

If the brass body has been rejected, or is not properly in place, and the screw may still be retained by the chuck subsequent to the good part ejection, and a finger is used for removing screws that might be retained on the chuck.

Then, the cycle is repeated.

The assembly process can be utilized with many different types of rotatably assembled parts, for example items that would cam lock together, nuts and bolts, screws and receptacles as shown, or types of devices which require a twist or turning at the same time that they are moved together along the rotational axis.

Thus, the present device includes a compound motion for assembly including rotation about an axis and an axially linear motion with respect to the axis of rotation.

Suitable modifications of the rotating support can be used to accommodate a large number of assembly devices. Means are provided for preventing one of the parts from rotating, while the other part is rotated for assembly at the same time the parts are permitted to move together, or are urged together under a desired spring force.

BRIEF DESCRIPTION OF THE DRAWINGS

FIG. 3 is a sectional view taken as on line 3—3 in FIG. 4;

FIG. 4 is a top view of the device of FIG. 1 with parts in section and parts broken away to show details of operating structure;

FIG. 5 is a sectional view taken at the elevation indicated by line 5—5 in FIG. 2, with the machine oriented in the same relative position as that shown in FIG. 1;

FIG. 6 is a fragmentary top plan view of a loading station showing a loading of a screw into a portion of the rotating turntable;

FIG. 7 is a sectional view taken as on line 7—7 in FIG. 6;

FIG. 8 is a vertical sectional view substantially on the same line as FIG. 7 but shown after the turntable has rotated several degrees to a position where a chuck is shown engaging and holding a screw for assembly purposes;

FIG. 10 is a fragmentary top plan view of a station for loading second parts onto the turntable of the present invention;

FIG. 11 is a vertical sectional view taken generally along the line 11—11 in FIG. 4;

FIG. 11A is a fragmentary sectional view of the chuck shown in FIG. 11 and substantially along the same line of sight showing the position of the chuck when two parts are properly positioned while at the inspection station;

FIG. 12 is a fragmentary top plan view of a station for ejecting parts which do not assemble properly;

FIG. 13 is a sectional view taken as on line 13—13 in FIG. 12;

FIG. 14 is a fragmentary view taken substantially on line 14—14 in FIG. 2; and

FIG. 15 is a fragmentary schematic view taken generally along line 15—15 in FIG. 5.

DESCRIPTION OF THE PREFERRED EMBODIMENT

Figure 1:
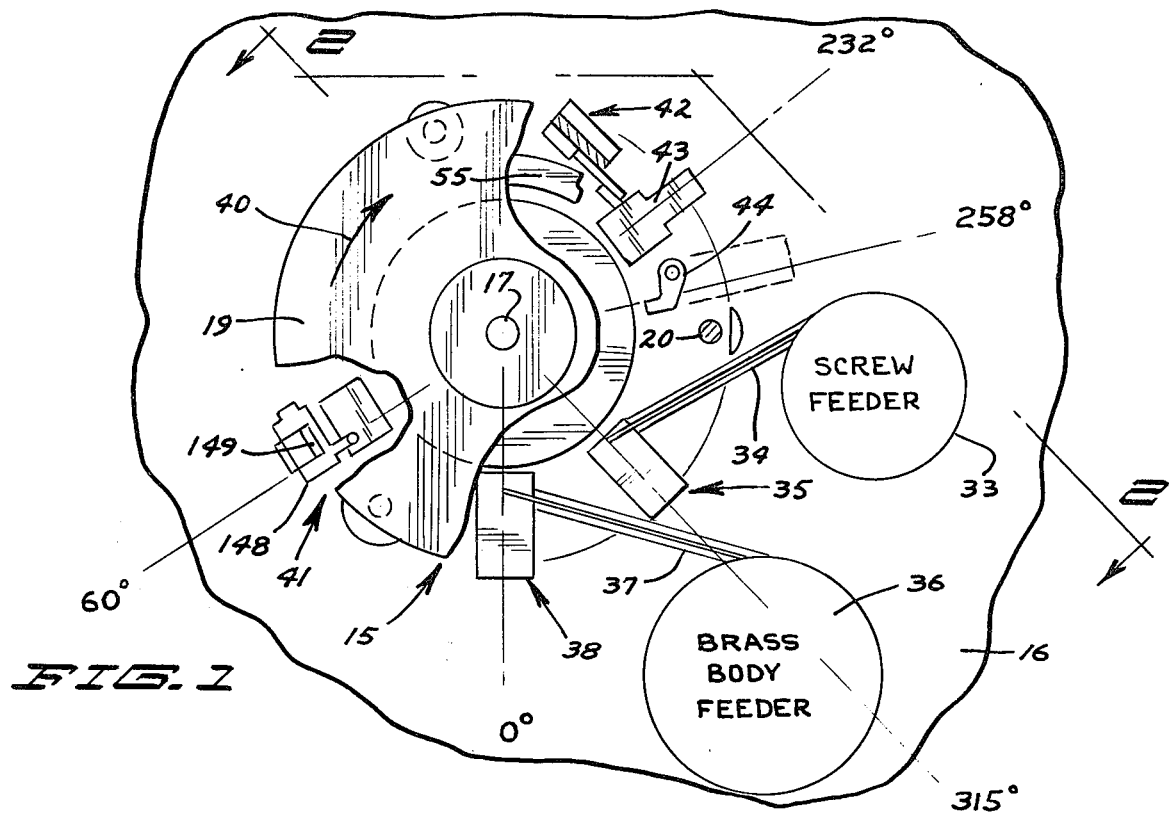
FIG. 1 is a top plan schematic view showing a typical layout of the assembly machine of the present invention.
Figure 2:
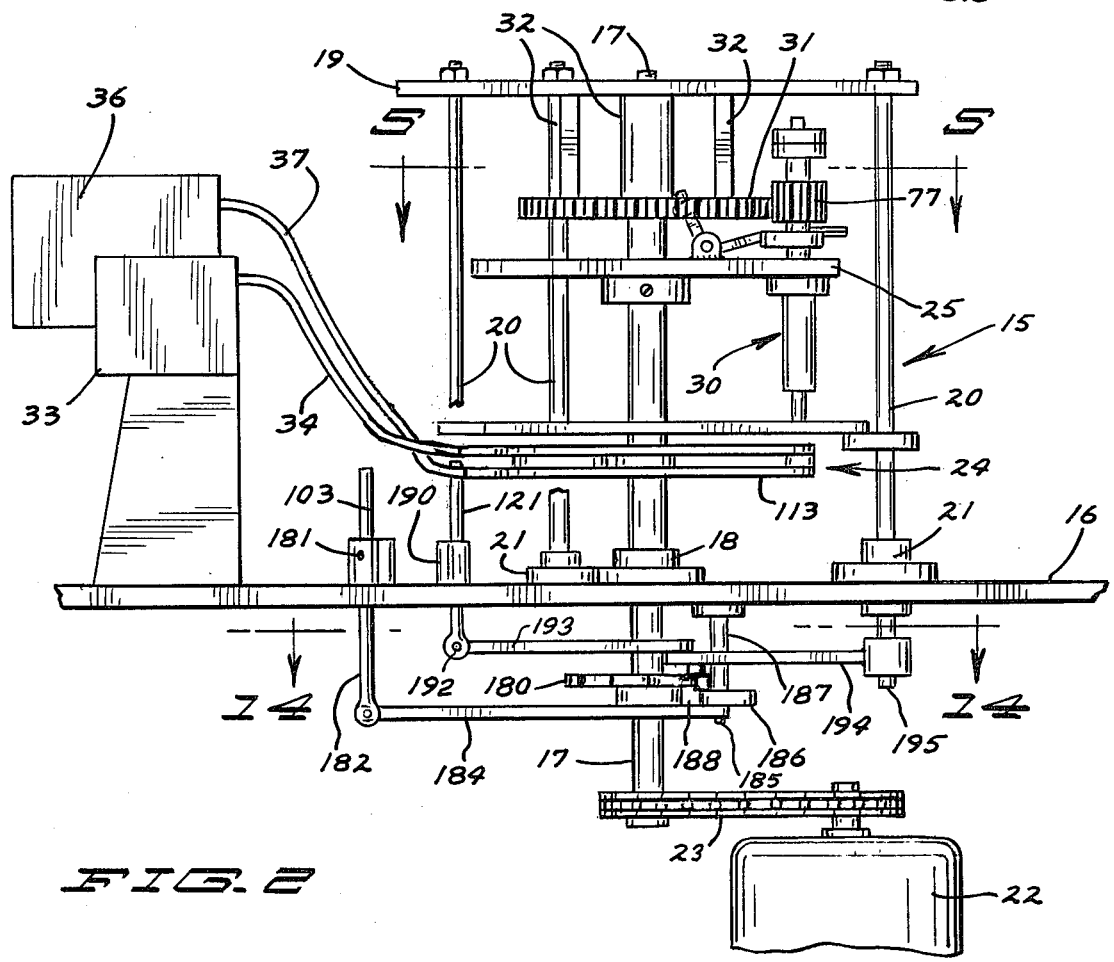
FIG. 2 is a side view thereof taken as on line 2—2 in FIG. 1.

Referring first to FIGS. 1 and 2, a machine indicated generally at 15 includes a support frame or table 16 that is mounted on suitable legs (not shown) with respect to a supporting surface such as the floor. The table is used for the main support, and it rotatably mounts an upright center shaft 17 that is on suitable bearings 18. Center shaft 17 is also supported with a top plate 19, which plate in turn is supported on columns 20, that in turn are fixed through suitable housings 21 to the table. The shaft 17 extends downwardly below the table, and is driven by a motor and gear reducer unit indicated schematically at 22, through a suitable drive arrangement 23 such as a sprocket and chain drive, or a timing belt and pulley drive. The shaft 17 mounts a turntable assembly indicated generally at 24, so that the turntable assembly rotates with the shaft, and further has a support plate 25 positioned above the turntable assembly 24 that also rotates with the shaft and thus with the turntable 24.

The support plate 25 is used for mounting a plurality of assembly devices 30 which will be explained in detail subsequently. The assembly devices revolve around the axis of shaft 17 as the turntable 24 and plate 25 rotate. The assembly devices each include components that are rotated about an axis parallel to the axis of the shaft 17 by an intermeshing and driving of an individual gear 77 on each of the assembly devices 30 and a large nonrotating or stationary gear 31 which is mounted on suitable supports 32 with respect to the plate 19.

A first vibratory feeder 33 is mounted on a table 16 on suitable supports, and has a feed trough 34 leading therefrom, which leads to a first part loading station 35 in a cycle of operation. A second vibratory feeder 36 is mounted onto the table 16 with suitable supports and has a feed chute 37 leading to a second part loading station 38. These loading stations 35 and 38 are fixed adjacent to the periphery of the turntable assembly 24, and are used for loading parts into different portions of the assembly device, so that as the turntable 24 rotates, it will pick up parts at the first and second stations 35 and 38, respectively, and then as the turntable is rotated in the direction as indicated by the arrow 40, a first inspection station indicated generally at 41 inspects the parts, and if the parts are not as they should be due either to a missing part, or malformed parts, the part is rejected at an adjacent subsequent rejection station.

The, as the unit turntable rotates, assembly will take place between the two accepted parts that are to be assembled, and further inspection is made at a station indicated generally at 42 during the cycle of rotation so that if the parts are not properly assembled together they will be rejected at position 43. If parts are properly assembled together they will be removed at a position indicated at station 44 which is the good part removal, and then the cycle will repeat. In addition, there is a station for removing any individual parts left on the assembly device subsequent to the good part rejection 44.

It can be seen in FIG. 1, that the first station is located at 315° radial from the center of the shaft 17, with the second loading station indicated at the 0° radial where there should be two parts on the turntable.

Referring generally to FIGS. 3 and 4, further details of the device of the present invention are shown. The upper support plate 19 is broken away in FIG. 4, and also the mounting plate 25 is shown broken away. This therefore illustrates a substantial portion of the turntable illustrated generally at 24. The turntable assembly comprises a plate 48, that is drivably mounted onto the shaft 17, and has a plurality of assembly stations positioned adjacent the periphery thereof. In the form of the invention as shown, there are six assembly stations which can also be seen in FIG. 5, and each of these assembly stations is identical in construction.

As shown, in FIG. 4, a first assembly station illustrated generally at 49, and a second assembly station illustrated generally at 49A are in two different positions of the cycle of operation. The assembly stations each comprise a loading lever 50 that is positioned in a recess at the edge of the table 48. The loading lever 50 is pivotally mounted to the table 48 about a pivot axis with a suitable pin 51. The loading lever 50 has has a screw holding receptacle 52 defined at the outer edge thereof adjacent the end thereof opposite from pin 51. The lever 50 also carries a cam roller 53 on a short support member that is attached to the loading lever 50. The loading lever 50 is spring loaded about its pivot axis 51 with a tension spring 54, which tends to urge the outer end of the lever containing the recess or receptacle 52 radially outwardly from the edge of plate 48.

The lever 50 is held in its position as shown at station 49A throughout the major portion of the travel of the turntable in its cycle of operation by a part annular cam ring 55. The ring 55 is supported with suitable brackets 56 to each of the columns 20, and has an inner edge surface aligned horizontally with the rollers 53 to force the rollers and outer end of levers 50 radially inwardly against the action of the spring 54 so that the loading levers 50 are normally retracted to a position so that the receptacle 52 is within the peripheral edge of the plate 48. However, the cam ring 55, as shown, has an open section indicated generally at 60 where the rollers 53 are released, and the loading end of each of the loading levers 50 is permitted to spring outwardly as shown at loading station 49. In this position, as can be seen, the receptacle 52 of each of the levers that comes to this position will be outside the periphery of the plate 49, and the end of the lever 50 adjacent spring 54 will be held in a stopped position against a stop scres 61 (see FIG. 6) that can be adjusted so that the receptacles 52 are in the proper position for loading the first part to be assembled.

Referring specifically to FIG. 3, the assembly device 30 that is at the station 49 is shown. The assembly devices, as previously stated, are made to permit axial movement, that is movement in direction parallel to the axis of the shaft 17 (and their own rotational axis), and also will rotate one of the parts relative to the other. In the form shown, a mounting housing 63 is mounted adjacent the periphery of the mounting plate 25, and extends downwardly therefrom toward the turntable 24, and the plate 48. The housings 63 have internal linear bearings 64 which permit an inner housing 65 to move in axial direction, that is, in up and down direction as shown in FIG. 3. The housing 65 extends through housing 63 and through an opening in plate 25. The housing 65 in turn mounts a spindle assembly 66 which can be rotated with respect to the housing on suitable bushings. A coupling member 67 is used for attaching a spring loaded chuck 68 to the lower end thereof. The chuck 68 is a four jaw chuck that is used for gripping the head of a screw to be driven, and has an internal screwdriver that will be more clearly shown, which can be used for driving the screw.

The housing 65 extends through an opening in the plate 25 to the upper side of the plate 25, as shown in FIG. 4 and has a clamp member 70 adjustably fixed thereon. The clamp member 70 in turn is connected through a suitable pivoting link 71 to a bell crank 72 that is pivotally mounted about an axis 73 to a bracket 74 that in turn is fixed to the plate 25. The bell crank 72 has a cam roller 75 on the opposite end thereof from the link 71, and this cam roller has a part spherical side that engages a cam surface 76 of the interior opening 84 defined in the center portions of the gear 31. A spring 77 is fastened with a suitable hook to the stationary housing 63, below the plate 25, and with a suitable hook to the end of the bell crank 72 near the link 71. This spring 77 tends to urge the bell crank end portion downwardly, and therefore tends to pull the housing 65 downwardly and thus urge the chuck 68 toward the turntable assembly. The position of the bell crank cam roller 75, however, determines how far downwardly the spring 77 can urge the chuck 68 (as long as the chuck is free to move otherwise), and thus the cam is the primary position control of the chuck 68 during its cycle of operation.

The outer edge of the gear 31, as shown, is a spur gear and this engages the small spur gears 77. Each spur gear 77 is rotatably mounted with respect to the center shaft or spindle 66. The internal construction is shown specifically in FIG. 11. The hub 78 of the gear 77 is drivably mounted to a first driving member 79 of a magnetic torque limiting clutch illustrated generally at 80. The second member indicated at 81 is drivably mounted with a suitable drive pin to the spindle 66, and the spindle thus will be driven whenever the gear 77 rotates until the torque on the spindle or the chuck which is also connected drivably to the spindle exceeds the level of the magnetic torque limiting clutch 80.

As stated previously, the gear 31 is stationary, and mounted to the plate 19 through supports 32. This means that whenever the plate 25 rotates with the shaft 17, the gears 77 act like satellite gears and rotate about their axes as they also revolve about the axis of shaft 17 with the plate 25. This then will cause each of the chucks 68 to be driven continuously as the plate 25 is driven.

In the position shown in FIG. 3, the chuck 68 is at its highest possible position because of the formation of the cam surface 76. This can be seen in FIG. 5, and this high position is approximately at the 290° radial of the cam. In FIG. 5, the gear 31 is shown, and the interior portion or center portion 84 of the gear 31 is cut away to leave an opening and the peripheral edge of this opening is the cam surface 76. There are six stations, as shown in FIG. 5, and each of the individual cam rollers 75 is shown therein. As can be seen, the chuck 68 is positioned aligned with and above the end of the loading lever 50 which is shown in FIG. 3.

A screw removal finger member indicated generally at 83 is attached to one of the brackets 56 for holding the cam 55 in place, and the finger 83 extends to position as can be seen in FIG. 4 so that it will intercept any screws that are held in the chuck member 68 prior to the time the chuck comes to the position as shown in FIG. 3. Thus the chuck will be free of any parts and will be ready to load the first part, in this form of the invention a screw, into the chuck.

Assuming that the drive motor is running so that the plate 25 and the turntable 24 are rotating, when an assembly device 30 moves past the position of station 49, it comes to a first part loading station indicated generally at 35. This first part loading station of the present form of the invention, is, as previously shown in FIG. 1, on the 315° cam radial from the center of the shaft 17. This first part loading station is shown in top view in FIG. 6 in greater detail. The part feeder trough 34 is carrying slotted head screws 90 under gravity, from the vibratory feeders that are well known in the art. These screws slide down through the trough 34 into a slot 91 in a loading block 92. The slot 91 is shown in FIG. 6 as being free of screws, but it is to be understood that the screws will go all of the way to the end of the slot under gravity.

The slot 91 is of sufficient width to receive the threaded shank of the screw, but the head of the screw is supported on the top of the loading block 92. The loading block 92 is supported with respect to the table 16 in the suitable support 93, as shown. The loading block includes a transverse recess of the same depth of the slot 92, and this recess intercepts the slot 92. A loading plunger or slide indicated generally at 94 is slidably mounted in the recess or slot at right angles to the slot 92, for movement toward and away from the periphery of the rotating plate 48.

In addition, a screw retainer guide indicated generally at 95 is mounted onto an arm 96 that is pivotally mounted as at 97 to the loading block, and is spring loaded with a spring 98 (see FIG. 4).

The guide 95 is thus spring loaded toward the peripheral edge of the plate 48, but is spaced from this edge as shown. A stop member indicated generally at 99 can be used and adjusted so that the edge of the guide 95 is at the desired location. As shown, when the unit is in the position of FIG. 6, the edge of the guide member is very closely adjacent the edge of the loading lever 50 by the receptacle 52 and is horizontally aligned therewith (see FIG. 8).

The plunger 94 is slidably mounted underneath a cover plate 100, as shown in FIG. 4, and the plunger has a bracket 101 mounted on the outer end thereof which is slidably mounted on a suitable support pin 102. The plunger is actuated in back and fourth direction by a lever 103 that is pivoted to supports on table 16 and is operated through a cam and cam follower arrangement below the table as will be explained subsequently. The upper end of lever 103 will move back and forth to reciprocate the plunger 94. The plunger 94 is moved to actuated position as shown in FIG. 6 wherein a screw 90 is positioned so that the shank of the screw is seated within the receptacle 52 of the aligning loading lever 50, and the head of the screw is on the upper surface of the loading lever (see FIG. 7 as well). The plate 48 is continuously moving so the screw is picked up on the move. The plunger is then retracted to a position as shown in FIG. 7. FIG. 7 is included to illustrate the retracted position of the plunger, but it is to be understood that the plunger would stay in actuated position until the plate 48 had moved so that the loading lever 50 shown at FIG. 6 would have advanced to where the screw 90 in pocket 52 of that lever is supported by the end of the guide 95. Then the plunger 94 retracts so that another screw 90 moves from the slot 91 into the slot at right angles thereto and aligned with the end of plunger 94. When the plunger again operates it will push the next screw 90 into the receptacle 52 on the next rotationally trailing loading lever 50.

As the plate 48 continues to rotate, the screw 90 that was placed into the receptacle 52 of the loading lever 50 shown in FIG. 6 will be supported by the guide 95 and held in place in the receptacle. The screw head will be supported on the guide 95 and the surface of lever 50 surrounding the receptacle 52.

As the plate 48 rotates, it can be seen in FIG. 5 that the cam surface 76 changes in distance from the axis of shaft 15 so that the spring 77 for the assembly device positioned above the screw that is being loaded urges the housing 65 and the spindle carried thereby toward the plate 48, and the cam roller for the bell crank is permitted tomove outwardly from the axis of the unit so that the chuck 68 moves down toward plate 48. As can be seen, the 315° radial of FIG. 5 is the first loading position, and when that unit moves approximately 10° to the 325° radial, the chuck will have moved down to position as shown in FIG. 8. A screw 90 held in receptacle 52 is picked up in the jaws of the chuck 68.

Figure 9:
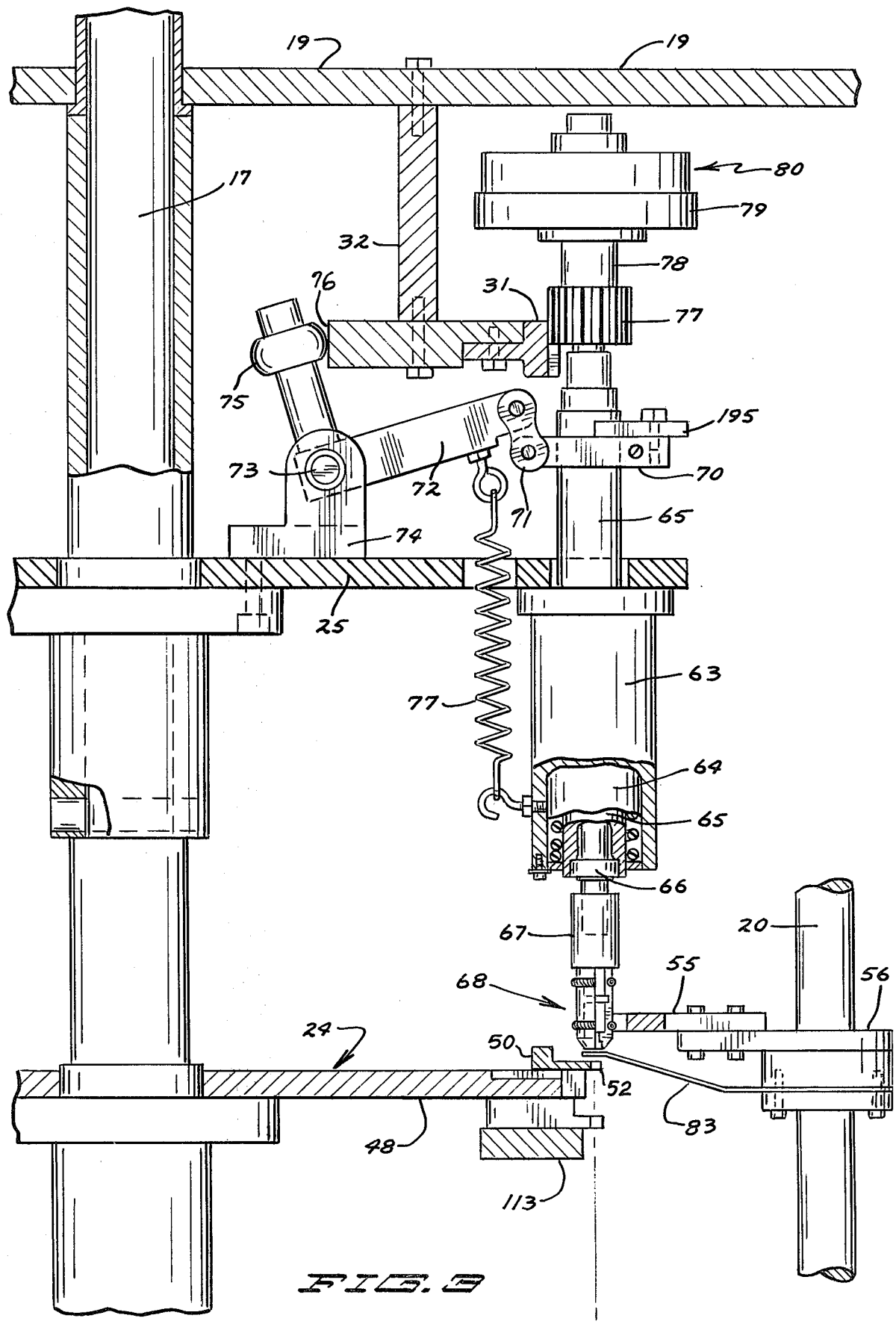
FIG. 9 is a sectional view taken as on line 9—9 in FIG. 8.

The chuck itself is a simple four jaw spring loaded chuck four individual jaw segments indicated at 105 (see FIG. 9 as well) that are completely separated or loose. These segments are arranged around a central hub 106 comprising the lower end of coupling member 67 which has an annular shoulder ring 107 that fits within a mating receptacle in the jaw segments 105. The jaw segments 105 then in turn are held on this ring 107 with garter springs 108 so that the jaw segements are retained in position, and cannot move axially, but can expand radially against the action of the garter springs. The lower ends of the jaws 105 have a short taper so that they will slip over the head of a screw 90 as shown in FIG. 8, and in the interior of the ends of the jaws there is a screwdriver member 109. The screwdriver member 109 is a cylindrical member having a head at its upper end indicated at 110, and this screwdriver member fits inside the sleeve portion 106 of the coupling member 67. The coupling member 67 in turn is pinned or suitably driven with respect to the spindle 66. Thus the spring loaded chuck will resiliently, frictionally grip the outer edges of the head of the screw and hold it in position. It is to be remembered that as the chuck is moving down, it is also rotating and as the guide member 95 provides some friction force to resist rotation of the screw as the chuck comes down onto it, the screwdriver will slip into place on the head.

The screw 90 is thus held in proper position by the chuck. After this screw pick up action has occurred, it can be seen that the end indicated at 55A of the cam ring 55 will engage the roller 53 for that particular loading lever and retract the loading lever back to the position as shown at station 49A so that it is out of the way of the chuck before the particular station where the screw has just been loaded and will come to the station for loading the second part. The second part loading station indicated generally at 38 is generally identical in operation to the station for loading the first part except for position and for the size and position of the parts.

Referring generally to FIGS. 4, 7 and 8, as well as to FIG. 10, it can be seen that the turntable assembly 24 includes a bottom annular support ring 113, that aligns with the peripheral edge portions of the rotating plate 48, and this ring 113 is shown in section in FIGS. 7 and 8, as well as in plan view in FIGS. 4 and 10. Also, it is shown in edge view in FIG. 2.

The ring 113 is spaced below the rotating plate 148, and is held in spaced location through the use of a second part nest and guide indicated generally at 114 at each assembly station. The second part nest and guide has a raised portion that clamps against the bottom of the plate 48, and against the top of the ring 113, and bolts past through these two parts 48 and 113 to clamp them together with nest 114 between. The second part nest and guide 114 has an outer edge portion indicated at 115 that is reduced in vertical height from the spacer portion of nest 114. A receptacle 116 that is the size to receive the second part indicated generally at 117 is defined in the edge of portion 115. The second part is a brass terminal that is a cylindrical body having a threaded opening therein into which the screw 90 will fit. In other words, the second part is some type of device that will be rotationally assembled with the first part. The receptacle or nest 116 is of size so that it engages the outer periphery of the second part and has a small ledge as can perhaps best be seen in FIG. 11 that will receive the lower edge portion of the second part 117 and support the part on the small ledge portion of the nest. The nest also has a surface that partially surrounds the side surface of the part.

When a loading or assembly station is positioned adjacent to the second part loading position 38, as shown in FIGS. 4 and 10, the nest 116 will be aligned with the second part loading block. Of course, the chuck 68 will be holding the screw, but the cam surface 76 will act on the associated bell crank to hold the chuck in a position so that it is not interfering with the nest 116 or the reduced height portion 115 of the nest. The loading station 38 includes a loading block 120 positioned on the table 16 adjacent the periphery of the turntable. The block 120 is substantially similar to the loading block 92 previously mentioned except for the size of the slots, which are of size to receive and guide the second part. The second part 117 is of larger diameter than the screw shank. Feed chute 37 carries the parts 117 from the vibratory conveyor under gravity, and the parts then slide in a slot 121A in the upper surface of the block 120. A movable plunger 122 is slidably mounted on the block 120 at substantially right angles to the slot 121A (the included angle is not quite 90°) and the plunger 120 has an actuating pivoting lever member 121 that will be more fully explained, which is pivoted on supports on table 116 and the upper end of lever 121 is reciprocated under action of a cam and roller drive positioned under the table. The upper end of lever 121 is coupled to a bracket 101 identical to the bracket 101 in the first loading station. The plunger 122 is configured to slide the part 117 at the end of the row of parts in slot 121A to position as shown in FIG. 10, and to thus push this second part 117 into the nest 116, where it will be supported.

The loading block 120 is positioned on a level so that the second parts 117 will be aligned with the receptacle 116 when the plunger moves them into position. As soon as the plunger moves a part 117 into position, it will remain in position holding the part on the small ledge formed at the bottom of the nest 116, and then the turntable will move so that the edge of a guide member 125 which is mounted on an arm 126 that in turn is pivoted as at 127 to the loading block 120, will engage the outer periphery of the second part 117 held in the loading nest and prevent the part from being removed or from falling out of the nest. The arm 126 is spring loaded with a spring 128 that urges the guide retainer 125 into its position where it will hold the second part 117 in the nest 116 as the unit rotates. The member 125 is similar to member 95 except that it horizontally aligns with the part 117 in the part nest 116.

The retainer member or holder for the second part has two portions. In addition to the main nest, a retainer finger indicated generally at 129 is pivotally mounted on a pin 130 that is in turn mounted through the ring 113. The finger 129 has a recess 131, and the pin 130, as shown, is positioned so that it is substantially on a radial line from the center of the nest 116 holding the second part 117. A spring loaded detent ball 132 is mounted in the second part loading and holding member 114, and is positioned with respect to the finger 125 so that the detent will hold the finger 129 in its unlatched position shown when the unit is loading as in FIG. 10, or in a second closed position which is shown in a station indicated generally at 132A in FIG. 10.

When the second part 117 is loaded, and the turntable rotates as shown by the arrow in FIG. 10, an outwardly extending portion 133 on the retainer finger 129 is positioned to be intercepted by a camming roller 134 that is rotatably mounted on the end of arm 135, that is turn is spring loaded with a spring 136 about a pivot pin 137. The pin 137 is fixedly mounted on an adjustable block 138 that in turn is attached to a support 139 that is fastened to the table 16. As soon as the trigger portion 133 goes past the roller 134, the finger 129 will be pivoted about pin 130 so that the outer end portion 140 of the finger passes around the outside of the second part retainer member 114. This closing action occurs at a time when the guide 125 is continuing to hold the second part in position. The guide may have a narrow lip that engages only a small portion of the top of part 117 while end portion 140 will pass under the guide and around the part 117. The outer end portion 140 fits around the second part 117 held in nest 116, and as shown at station 132A clamps the second part 117 against the surface of the nest and actually holds it with a spring force caused by the detent ball 132 acting on the detent recess of the finger 129.

The cam roller 134 is also shown in FIG. 11. In FIG. 11 an assembly device 30 is shown in a position showing the first inspection for proper parts or missing parts. FIG. 11 is taken along line 11—11 in FIG. 10, and actually is shown to illustrate the inspection for a missing screw, or a screw that has too small a shank to be properly threaded, or a second part that has too large an opening to be properly threaded with a screw. When the outer end portion 140 is moved to its closed position at approximately the 35° radial as shown on the cam in FIG. 5, the cam rollers will be permitted to move away from the center of the cam, and thus lower the controlled chuck under the action of the spring 77. If there is no screw in the chuck 68, or if for example it has a very small shank, or if the opening in the second part 117 is extremely large so the screw slips down, or if the part 117 is not securely held, the chuck will move downwardly to position shown in FIG. 11. When this happens, an upper switch actuator tab 145 will be aligned with a roller 146 on an end member 147 of a micro switch or limit switch 148. The limit switch 148 is supported on a support 149 from the upper support plate 19. The limit switch is shown in FIG. 10 and also in FIG. 11, and it can be seen that the tab will only align with the wheel 146 when the chuck is down, actually extending into a recess 150 at the periphery of the plate 48. The recess 150 is made so that the plate 48 will clear the chuck when the chuck goes to its lowered position as shown.

When the limit switch 148 is closed, it will actuate a valve 151 to energize a cylinder 152 and move the cylinder rod 153 to a position wherein it will force a spring loaded lever 154 into the path of the end portion 140 of the retainer finger 129. The lever 154 will thus intercept the part retainer when the lever is in its dotted line position and will cause the nest retainer finger to be swung to its open position releasing any part 117 held in the nest, and thus rejecting a second part. The operation will reject the second part if the second part is not properly held in the nest. In other words if there is anything that will cause the chuck to be permitted to move downwardly a greater distance than desired, it will reject the second part.

It should be noted that the cylinder 152 is mounted on an upright support 153, and the lever 154 is pivotally mounted as at 155 to a support 156 on the member 153. A spring 157 is used for spring loading the finger 154 away from the path of the nest retainer end portin 140.

If for example there is a screw 90 in position in the chuck, and also a second part 117 in position in nest 116, the chuck will only be permitted to move to its position shown in FIG. 11A by the time it gets to the micro switch roller 146, which is on the 50° radial. When both a screw and second part are present, it can be seen that they contact each other and because they have not had opportunity to thread together, the chuck 68 is raised substantially above it position shown in FIG. 11 and thus the tab 145 will clear the roller 146 (pass above it) and the nest closing finger 129 will remain in its closed position as shown at the station 132A and continue to clamp the second part 117 in the nest and hold it from rotation. It can be seen then that if the two parts are together as shown in FIG. 11A, the chuck 68 will be rotating and the screwdriver will begin driving the screw 90 while the second part 117 is held from rotation. The cam roller 75 controlling the axial position of the chuck will be spaced from the cam surface 76 at the 50° radial, but the chuck will be rotating and the screw will be threaded into the part 117 as the particular assembly device rotates from the 50° radial onward to substantially the 220° radial, at which time another check will take place.

During this rotation from the 50° radial to the 220° radial, the gear 77 will be driving the chuck 68 until the screw is positively seated in the part 117, and this will permit the chuck 68 to move downwardly as the screw threads in, even though both parts are present. The screw will be threaded until it bottoms out or hits an obstacle, at which time the torque limiting clutch 80 will slip, while the drive gear 77 on the particular assembly mechanism continues to rotate. The chuck however will not be rotating once the screw is properly seated.

As shown, in FIG. 5 at station 42 on about the 220° radial of the cam there is a roller 160 rotatably mounted on the end of an arm 161 which in turn is mounted onto a shaft 162 that is rotatably mounted into a bracket 163 that is fixed to plate 19 and depends therefrom. The arm 161 is prevented from letting the roller 160 move downwardly beyond a desired position by a stop member 164 that is positioned above the arm on the opposite side of the shaft 162 from the roller 160. Now, referring specifically to FIG. 15, when the screw and the second part 117 have been properly seated, the tab 145 will reach a level such that it will pass underneath the roller 160 when the roller is in its stopped position without any action. If the screw is not properly threaded into the second part 117, this tab 145 will be held up, for example in a dotted line position shown in FIG. 15, and when the tab reaches the 220° radial and is held up, it will lift the roller 160, causing the arm 161 to raise rotating the pin or shaft 162 and in turn depressing an end of actuating lever 165 that is on the opposite side of the support 163 from the arm 161. Movement of the actuating lever will in turn actuate (release) a micro switch 166, and this micro switch will energize a valve to actuate a cylinder 167 that is mounted on a support 168 and to move an actuating finger 169 corresponding to the actuating finger 154 to position to intercept the end portion 140 of the particular nest lock finger 129 at that position.

The high part eject station indicated at 43 utilizes this cylinder actuating the spring loader finger 169 which has a spring 170 to urge it to a retracted position, and the cylinder 167 has an actuating rod 171 that operates the finger by bearing against it and pushing it into the path of the portion 140 of the finger 129 to release first and second parts that are not fully assembled (threaded) together so that the chuck remains too high.

The finger 169 is substantially similar to the finger 154, and operates in much the same manner except that it has an additional part 169A that moves into position to engage a second part 117 held in the nest or a screw 90 which may be held in the chuck and actually strips the partially assembled parts (this would be a screw that is partially threaded into the bottom part 117) from the chuck so that it will drop off into a ramp 173 for the "high part reject" at the 232° radial.

As soon as the high part eject station has been passed, and assuming that the parts are properly assembled together so that the screw head rests against the top of the bottom part 117 and was not rejected, the chuck will start to lift because the of the cam surface 76 (see FIG. 5) becoming a raising cam lifting the chuck.

Now, referring specifically to FIG. 4, the high part eject station 43 has been passed, and then, the unit will move so that the end of the end portion member 140 will engage the end of a good part removal finger 175 at station 44 that will open the nest lock finger 129 in the same manner as lever 154 and 169, and drop the assembled good parts into a trough 176 where the assembled parts will be collected. It should be noted that the chuck will be lifted off the head of screw 90 of fully assembled parts by cam action between the high part check station at the 232° radial and the position of the good part eject station 44. The finger 175 is merely a member that is fixed on a support at a horizontal level to intercept the end portion 140 of the second part nest retainer finger 129 to move it to its open position as shown at station 38, and because the chuck will have been removed from any screw head in the fully assembled unit by being lifted through the camming action of the surface 76, the good part will be removed. The finger 175 is adjustable, but does not move during operation. Thus, any finger 129 in closed position moving past finger 175 will be opened.

In case there is a screw still held in the chuck, because of the absence of a second part 117, the finger 83 will engage the screw in the chuck as the turntable moves past the finger, and remove it from the chuck so that the screw will drop out before that particular assembly device comes back to repeat the process just described.

For reference purposes for appreciation of the relative position of the chuck, Table 1 below reproduces typical distances from the center of shaft 17 to the cam surface at the listed radial. Where the cam surface distance changes between two radials, the change is generally uniform. Where the cam surface distance remains the same between two radials, the cam surface is cylindrical for that distance.

TABLE I

| Radial | Distance from center of Shaft to Cam Surface |
| --- | --- |
| 0° | 3.43 |
| 35° | 3.895 |
| 50° | 4.03 |
| 240° | 4.03 |
| 290° | 3.34 |
| 315° | 3.34 |
| 325° | 3.47 |
| 332° | 3.47 |
| 342° | 3.43 |

Note: gear 31 approximately 14" pitch diameter

Previously it was mentioned that the loading plungers were operated by levers actuated by cam mechanism underneath the table 16. Referring now to FIG. 14, and also to FIG. 2, the part loading cam assembly includes a six lobe cam indicated at 180, that is drivably mounted on the shaft 17 and rotates therewith. The loader lever 103, as shown, is pivotally mounted (see FIG. 2) to a support member 181, on the table 16 and extends through the table. The lower end portion 182 of this lever is pivotally mounted as at 183 to a link 184. The link 184 in turn is pivotally mounted as at 185 to an actuating lever 186 that is pivotally mounted onto a shaft 187 fixed to the bottom side of the table 16. A cam roller 188 is mounted on the lever 186, and engages the periphery of cam member 180. The link 184 is spring loaded with a tension spring 189 so that the roller 188 is urged against the cam member 180, and each time the roller 188 enters one of the lobes, the actuator 103 pushes on the plunger 94 to push another screw into a loading position. The roller on lever 186 is positioned so that it times the action of the lever 103 to coincide exactly with the proper positioning of one of the assembly devices on the rotating turntable.

Likewise, the lever 121 for the second loading station is pivotally mounted about a horizontal axis to a bracket 190, and extends downwardly so that the lower end thereof is pivotally mounted as at 192 to a link 193 that is pivotally mounted to a lever 194 which in turn is mounted onto a depending shaft 195 attached to the table 16. The lever 194 has a roller 196 and a spring 197 is used for loading the link 193 so that the roller 196 engages the cam surface on cam 180 and is urged against the cam. The actuator 121 will also push its attached plunger to load the second parts 117 whenever the roller 197 enters one of the lobes of the cam 180. Thus the loading action is under the force of the springs 197 and 189, and the cam serves only to permit such loading action, but does not actually force loading action. The cam forces the levers to retract the plungers under positive mechanical force while the loading action is under a spring force to prevent damage to the parts.

The turntable cam be rotated at any desirable speed to perform the assembly of two relatively rotatable parts as the turntable rotates.

What is claimed is:

1. An assembling machine comprising a rotating mounting member, a plurality of assembly stations mounted on said rotating member each having an assembly member, each of said assembly members including means for receiving a first part to be assembled, means movable with said mounting member for receiving a second part to be assembled in position spaced from each of said assembly members, and means to mount each assembly member on its assembly station to cause motion of said assembly member toward said second part and to thereby cause engagement of the first and second parts in each assembly station, and means to relatively rotate said first and second parts at each assembly station to rotationally assemble said first and second parts as the corresponding assembly member moves toward said second part including torque limiting means to limit the amount of torque that can be exerted between said first and second parts.

2. The combination as specified in claim 1 wherein said means to rotate comprises a gear drive member continuously rotating said assembly members as the rotating mounting member rotates.

3. An assembling machine comprising a rotating mounting member, a plurality of assembly stations mounted on said rotating member each having an assembly member, each of said assembly members including means for receiving a first part to be assembled comprising a spring loaded chuck member to hold said first part, means movable with said rotating mounting member for receiving a second part to be assembled in position spaced from each of said assembly members, and means to mount each assembly member on its assembly station to cause movement of said chuck member toward said second part to cause engagement of the first and second parts in each assembly station, said means to cause movement of said chuck member being designed to permit greater movement of the chuck member toward the means to receive said second part than the movement permitted when a properly sized first part in said chuck member engages a properly sized second part held in in the corresponding means to receive said second part, checking means adjacent the path of rotation of said mounting member subsequent to the loading of said second part cooperating with said assembly member to determine if the chuck member moves toward said means to receive said second part more than a selected distance, means responsive to said checking means to release a second part if said chuck member moves toward said means to receive said second part more than a preselected distance, and means to relatively rotate said first and second parts at each assembly station to rotationally assemble said first and second parts as the corresponding chuck member moves toward a corresponding second part.

4. A machine for assembling a pair of parts that are threadably mounted together, including a continuously rotating support frame, means on said frame defining a plurality of individual assembly stations spaced radially from the center of rotation of said frame, said assembly stations each including a first reciprocating, rotating assembly member, means to rotate each assembly member about an axis spaced from the axis of rotation of said frame, means on said assembly member for gripping and holding a first part, means to move a first part into position aligned with said assembly member, and means to move said assembly member in its reciprocating path whereby said first means engages and holds a first part, second means to supply a second part and being positioned adjacent said rotating frame in a rotational position so that each assembly member passes said second means subsequent to the first means in a cycle of operation, means on the frame aligned with the axis of rotation of each of said assembly members for receiving a second part from said second means including means to resiliently, releasably hold a second part from rotation, and means to move said assembly frame toward said second part and to rotate said assembly member about its axis to threadably mount said first and second parts together.

5. The combination as specified in claim 4 wherein said means to move said assembly member toward said second part permits movement of said reciprocating assembly member toward said second part a greater distance than that which is permitted when properly sized first and second parts engage, and means to determine when said reciprocating assembly member moves toward said second part more than a preselected amount, said means to determine being rotationally positioned in a cycle of operation subsequent to position where said reciprocating assembly member moves said first part toward the second part.

6. The combination as specified in claim 5 wherein said means to cause movement of said assembly member includes means to reciprocate said assembly member a preselected distance with respect to said second part after said assembly member has been moved with said frame for a preselected rotational distance to remove a first part threaded to said second part from the assembly member.

7. The combination of claim 6 and means to eject properly assembled first and second parts from said means to hold a second part at a rotational position subsequent to the position where said first and second parts are threaded together and the first part is removed from said assembly member.

8. The combination as specified in claim 4 and torque limiting means to limit the amount of torque exerted by said assembly member when threading said first and second parts together.

9. The combination as specified in claim 4 wherein said means to rotate said assembly member comprises a first fixed gear member mounted to be held stationary with respect to said rotating frame, and a second gear mounted on each of said assembly members and engaging said first gear whereby the second gears continuously rotate said assembly members as the frame rotates.

10. The combination as specified in claim 7 and assembly checking means positioned rotationally subsequent to location where properly assembled first and second members are threaded together a desired amount to determine if the assembly member has moved toward the corresponding second part a desired distance, and means to eject parts associated with an assembly member which has not moved toward its corresponding second part a sufficient distance to insure complete assembly of said parts, said assembly checking means and said last mentioned means to eject being rotationally leading the means to eject properly assembled first and second parts.

* * * * *